(12) United States Patent
Kim et al.

(10) Patent No.: US 6,295,233 B1
(45) Date of Patent: Sep. 25, 2001

(54) CURRENT CONTROLLED OPEN-DRAIN OUTPUT DRIVER

(75) Inventors: Y. H. Kim, KyoungSanBuk-Do; Ki Bong Ku, KyungKi-Do, both of (KR)

(73) Assignee: Hynix Semiconductor (KR)

( * ) Notice: Subject to any disclaimer, the term of this patent is extended or adjusted under 35 U.S.C. 154(b) by 0 days.

(21) Appl. No.: 09/617,362

(22) Filed: Jul. 17, 2000

Related U.S. Application Data

(60) Provisional application No. 60/144,451, filed on Jul. 19, 1999.

(51) Int. Cl.[7] .................................................... G11C 7/00
(52) U.S. Cl. .............................. 365/189.11; 365/189.05
(58) Field of Search ........................... 365/189.11, 189.05, 365/185.23, 189.08, 189.01, 222; 326/82, 86

(56) References Cited

U.S. PATENT DOCUMENTS

| | | | | |
|---|---|---|---|---|
| 5,255,222 | * | 10/1993 | Eaton, Jr. ......................... | 365/189.11 |
| 5,903,501 | * | 5/1999 | Vurosaki ........................... | 365/189.11 |
| 5,917,758 | * | 6/1999 | Veeth ................................ | 365/189.11 |
| 5,959,926 | * | 9/1999 | Jones ................................ | 365/189.11 |

OTHER PUBLICATIONS

Kim et al., "A 640MB/s Bi–Directional Data Strobed, Double–Data–Rate SDRAM with a 40mW DLL Circuit for a 256MB Memory System," *ISSCC Digest of Technical Papers*, pp. 158–159 (Feb. 1998).

Gabara et al., "Forming Damped LRC Parasitic Circuits in Simultaneously Switched CMOS Output Buffers," *IEEE J. Solid–State Circuits*, vol. SC–32, pp. 407–418 (Mar. 1997).

Hatakeyama et al., "A 256Mb SDRAM Using a Register–Controlled Digital DLL," *ISSCC Digest of Technical Papers*, pp. 72–73 (Feb. 1997).

Kushiyama et al., "A 500–Megabyte/s Data–Rate 4.5M DRAM," *IEEE J. Solid–State Circuits*, vol. SC–28, pp. 490–498 (Apr. 1993).

* cited by examiner

Primary Examiner—Tan T. Nguyen
(74) Attorney, Agent, or Firm—Townsend and Townsend and Crew LLP

(57) ABSTRACT

New methods and circuits for implementing current controlled open-drain output drivers are introduced. The present invention can be incorporated into a number of digital devices which utilize output drivers including, for example, high bandwidth DRAMs. In an exemplary embodiment, the present invention includes an on-chip current control circuit, a current control register, a switching controller, and a number of binary-weighted transistors arranged in a parallel configuration, all of which are implemented on an integrated circuit chip. The current control circuit continually generates a digital code which is periodically recorded by the current control register. The current control register then passes the digital code to the switching controller. Using the digital code, the switching controller, in turn, activates or deactivates the appropriate binary-weighted transistors accordingly thereby maintaining a relatively stable output current for the output driver.

24 Claims, 5 Drawing Sheets

CURRENT CONTROLLED OPEN-DRAIN OUTPUT DRIVER

CROSS-REFERENCES TO RELATED APPLICATIONS

This application claims the benefit of priority under 35 U.S.C. § 119 from U.S. Provisional Patent Application Ser. No. 60/144,451 filed on Jul. 19, 1999, the disclosure of which is hereby incorporated by reference in its entirety for all purposes.

BACKGROUND OF THE INVENTION

The present invention relates in general to integrated circuitry, and in particular to an improved current-controlled open-drain output driver.

Since the adoption of the reduced instruction set computer (RISC) architecture, the central processing unit (CPU) speed has been increasing rapidly year after year. On the other hand, the speed of memory devices such as dynamic random access memory (DRAM) has not nearly kept up with the rapid increase in CPU speed. In fact, the gap between the respective speeds of CPUs and memory devices has been widening in recent years.

Since memory is a common component in digital devices, the speed of the memory in many applications affects the overall performance of digital devices. As a practical matter, a CPU in most cases cannot effectively perform its functions until and unless it receives the requisite data from the appropriate memory device. Hence, the speed difference between CPUs and memory devices has created a performance bottleneck.

In an effort to catch up with the rapid enhancement of CPU performance, a number of improved memory devices, such as Rambus DRAM (RDRAM) and Synchronous DRAM (SDRAM), have been introduced. These improved memory devices generally provide high bandwidth memory transfers by using high speed output drivers. Further information regarding high bandwidth DRAMs can be found in A. Hatakeyama et al., "256 Mb SDRAM Using a Register-Controlled Digital DLL," ISSCC Digest of Technical Papers, pp. 72–73, February 1997; C. Kim et al., "A 640 MB/s Bi-Directional Data Strobed, Double-Data-Rate SDRAM with a 40 mW DLL Circuit for a 256 MB Memory System," ISSCC Digest of Technical Papers, pp. 158–159, February 1998; and N. Kushiyama et al., "A 500-Megabytes/s Data-Rate 4.5M DRAM," IEEE J. Solid-State Circuits, vol. SC-28, pp. 490–498, April 1993.

FIG. 1 illustrates an example of a high speed output driver circuit in accordance with an RDRAM design. An NMOS transistor (NM) has an open-drain design. The drain node of the transistor (NM) is connected in series with an off-chip termination resistor 10 and a termination voltage source 12 through an off-chip transmission line. Typically, the termination resistor 10 has a value of $R_T=40 \Omega$ and the termination voltage source 12 may have a value of $V_{TT}=1.8V$. The drain node voltage of the transistor (NM) is used to provide the output voltage used to drive external devices coupled to the pad (PAD). Hence, the drain node voltage, or conversely, the voltage swing across the termination resistor 10, should ideally be kept at a stable level. The voltage swing across the termination resistor 10 is determined by the drain (or output load) current $I_{OL}$ of the turned-on open-drain NMOS transistor (NM). The drain current in turn is affected by the supply voltage, which in this case is the termination voltage source 12, and variations in temperature.

Circuit techniques have been developed to keep the output current $I_{OL}$ stable and insensitive to variations in temperature and supply voltage. An example can be found in N. Kushiyama et al., "A 500-Megabytes/s Data-Rate 4.5M DRAM," IEEE J. Solid-State Circuits, vol. SC-28, pp. 490–498, April 1993, and Thaddeus J. Gabara et al., "Forming Damped LRC Parasitic Circuits in Simultaneously Switched CMOS Output Buffers," IEEE J. Solid-State Circuits, vol. SC-32, pp. 407–418, March 1997. In Kushiyama et al., the open drain NMOS transistor is split into binary-weighted transistors, the ON/OFF condition of which is determined by a digital code. This digital code is generated by an external source in the system and sent to the output driver periodically. The generation of the digital code by an external source necessarily causes overhead in the system. Accordingly, a technique would be desirable for reducing the overhead of generating a digital code from an external source for compensation of temperature and supply voltage variations.

SUMMARY OF THE INVENTION

New methods and circuits for implementing current controlled open-drain output drivers are introduced. The present invention can be incorporated into a number of digital devices which utilize output drivers including, for example, high bandwidth memory circuits.

In an exemplary embodiment, the present invention includes an on-chip current control circuit, a switching controller, and a first group of binary-weighted switching devices arranged in a parallel configuration, all of which are implemented on an integrated circuit chip. The current control circuit continually generates a digital code which is passed onto the switching controller. Using the digital code, the switching controller activates or deactivates the appropriate binary-weighted switching devices accordingly thereby maintaining a relatively stable output current $I_{OL}$ for the output driver.

In another embodiment, the present invention further includes a current control recording device, preferably, implemented in the form of a register. The current control recording device periodically records the digital code generated by the current control circuit and then passes the digital code onto the switching controller.

In a further embodiment, the current control circuit in accordance with the present invention includes a comparator, an up/down counter, a bandgap reference current generator, and a second group of binary-weighted switching devices arranged in a parallel configuration. The bandgap reference current generator provides a relatively stable current source for the second group of binary-weighted switching devices. The comparator generates a comparison result based on a comparison of the drain node voltage of the second group of binary-weighted switching devices with a reference voltage. The comparison result is used by the up/down counter to generate the digital code. The digital code, in turn, is fed back to the second group of binary-weighted switching devices to effect their appropriate activation or deactivation. The digital code is also fed to the switching controller thereby causing the first group of binary-weighted switching devices to be turned on/off appropriately. By configuring the current control circuit in the foregoing manner, a feedback loop is formed to generate a digital code which can then be used to maintain a relatively stable voltage at the output of the output driver.

The present invention provides a number of advantages over conventional output drivers. For example, by implementing the output driver on an integrated circuit chip in accordance with the present invention, the overhead of generating a digital code from an external source to maintain a stable voltage at the output of the output driver is reduced. Furthermore, by using a bandgap reference current generator as part of the output driver, the output current of the output driver can be maintained at a relatively stable level with regard to any variation in temperature and/or supply voltage.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DESCRIPTION OF THE SPECIFIC EMBODIMENTS

Figure 2:
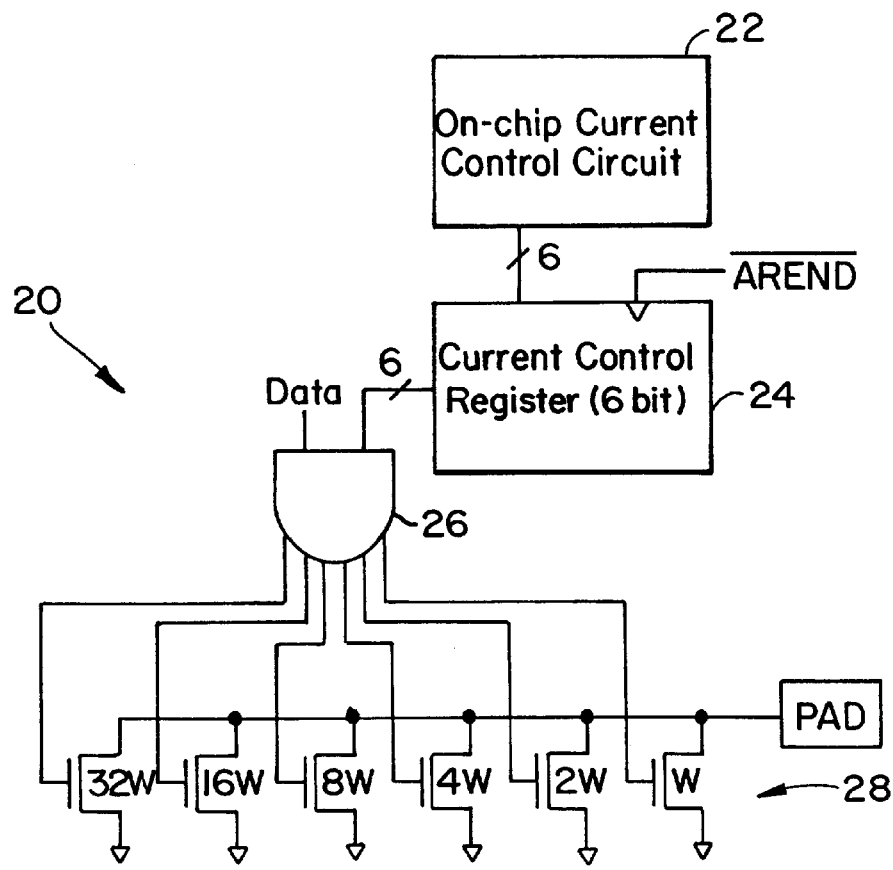
FIG. 2 is a simplified schematic diagram illustrating an embodiment of the open-drain output driver in accordance with the present invention.

The present invention will now be described in detail in connection with specific embodiments. FIG. 2 illustrates an exemplary embodiment of an open-drain output driver in accordance with the present invention. The output driver circuit 20 includes an on-chip current control circuit 22, a current control register 24, a switching controller 26, and a number of binary-weighted NMOS transistors 28. Preferably, all the elements of the output driver circuit 20 are implemented on a single integrated circuit chip. Details of the elements of the output driver circuit 20 will be described below. In this exemplary embodiment, the output driver circuit 20 in part utilizes signals commonly found in a conventional memory device, such as a DRAM, as will be further described below. However, it should be understood that the output driver circuit 20 can also be used in cooperation with other types of devices.

As shown in FIG. 2, the output driver 20 includes the current control circuit 22. The primary function of the current control circuit 22 is to generate an output which is then used to control the binary-weighted NMOS transistors 28 in such a way, as will be described below, that the drain node voltage of the binary-weighted NMOS transistors 28 is maintained at a relatively stable value even with variations in supply voltage and/or temperature. In this embodiment, the output of the current control circuit 22 is selected to be a 6-bit digital code.

The current control circuit 22 is coupled to the current control register 24. The current control register 24 is a 6-bit register which serves to receive and record the output, in this example, the 6-bit digital code, from the current control circuit 22. The load input of current control register 24 receives a signal $\overline{AREND}$. In a specific embodiment, load signal $\overline{AREND}$ represents the end of an auto refresh cycle in a DRAM. Accordingly, a new 6-bit output from the current control circuit 22 is loaded into the current control register 24 at the end of each auto refresh cycle. The advantages of loading register 24 at the end of each auto refresh cycle will be described below.

The current control register 24 is coupled to the switching controller 26. The switching controller 26, in turn, is coupled to the binary-weighted NMOS transistors 28. The switching controller 26 receives a data signal at one input and the recorded 6-bit digital code of the current control circuit 22 from the current control register 24 other inputs. Using the data signal and the recorded 6-bit digital code, the switching controller 26 then selectively activates/deactivates the binary-weighted NMOS transistors 28. More specifically, a binary-weighted transistor 28 is turned on when both the data signal and the selected bit of the digital code coupled to that transistor 28 are in, for example, a logic "1" or "high" state. The six bits of the code correspond to the six binary-weighted driver transistors.

The combinations of the six binary-weighted NMOS transistors 28 allow 64 ($2^6$) different levels of $I_{OL}$ (the on current of the output driver 20). Thus, $I_{OL}$ can be maintained at a relatively stable value in spite of variations in temperature and supply voltage by selecting, for example, one of these 64 combinations to adjust the current drive. For example, if a termination resistor and the characteristic impedance of a transmission line is collectively set to about 40 Ω and $I_{OL}$ is maintained at roughly 20 mA, then the voltage swing across the termination resistor can be maintained at a relatively stable value of about 0.8V (20 mA×40 Ω), by varying the 6-bit code when necessary (e.g., when compensating for temperature variations).

The output driver 20 as shown in FIG. 2 generally operates as follows. After the system is initially powered on, the current control circuit 22 runs through a number of successive auto refresh cycles (for example, eight auto refresh cycles) to achieve an initial optimal value expressed in the form of an initial digital code. This initial optimal value is then recorded by the current control register 24 and subsequently used to control the switching of the binary-weighted transistors 28. The optimal value for the output driver 20, however, can vary during the operation of the memory device if the supply voltage and/or the temperature begin to drift. In order to maintain the output driver 20 at the optimal level, the current control register 24 can be updated by the current control circuit 22 on a regular basis at the end of every auto refresh cycle. For example, the current control register 24 can be updated once every 15.6 μs, which is the period for an auto refresh cycle in a DRAM. The digital code is then relayed to the switching controller 26. The switching controller 26 subsequently switches on or off the appropriate binary-weighted transistors 28 to maintain a relatively stable drain current.

Figure 3:
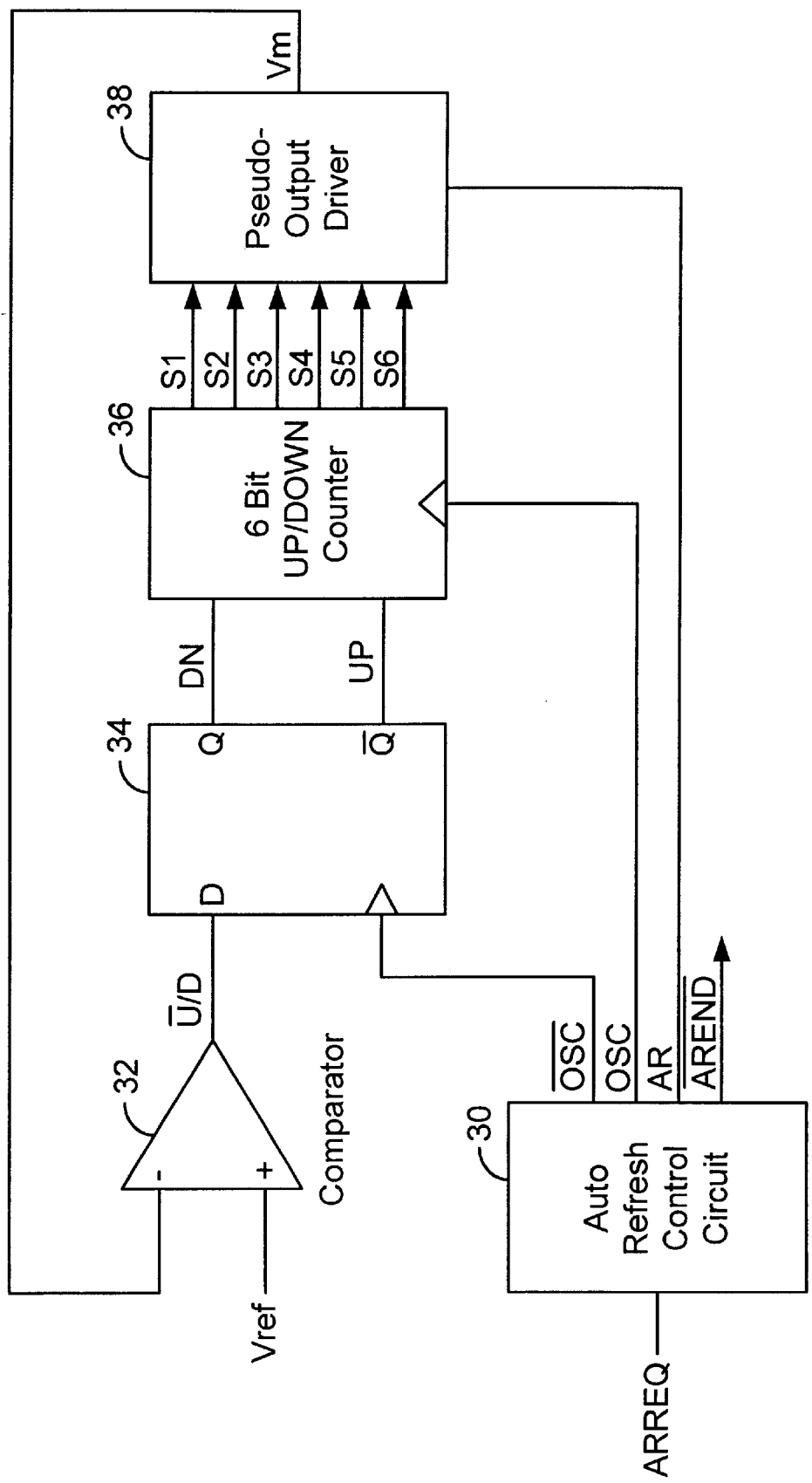
FIG. 3 is a simplified schematic diagram illustrating an embodiment of the current control circuit in accordance with the present invention.

FIG. 3 illustrates an exemplary embodiment of the current control circuit 22 in accordance with the present invention. In this embodiment, the current control circuit 22 includes an auto refresh control circuit 30, a comparator 32, a D flip-flop 34, a 6-bit up/down counter 36, and a pseudo-output driver 38. The comparator 32, the D flip-flop 34, the 6-bit up/down counter 36 and the pseudo-output driver 38 are all coupled in series with the output of the pseudo-driver 38 connected back to the input of the comparator 32, thereby forming a feedback loop. Various signals from the auto refresh control circuit 30, including AR, OSC and $\overline{OSC}$ are used to control the feedback loop. For example, the AR signal is fed into the pseudo-output driver 38, and the $\overline{OSC}$ and OSC signals from the auto refresh control circuit 30 are coupled to the D flip-flop 34 and the 6-bit up/down counter 36, respectively.

Figure 1:
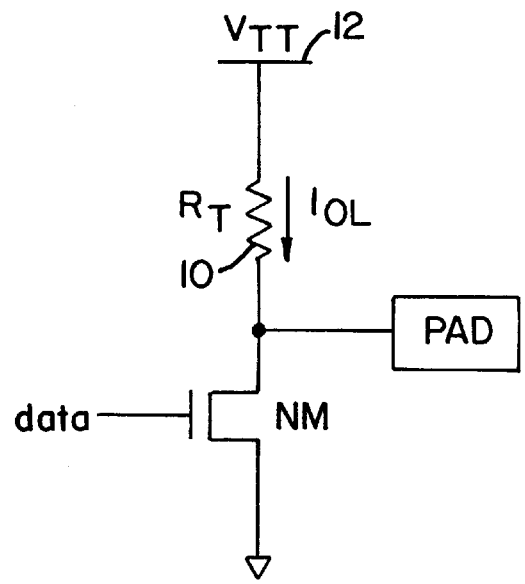
FIG. 1 is a simplified circuit diagram showing a conventional circuit of a high speed output driver.
Figure 4:
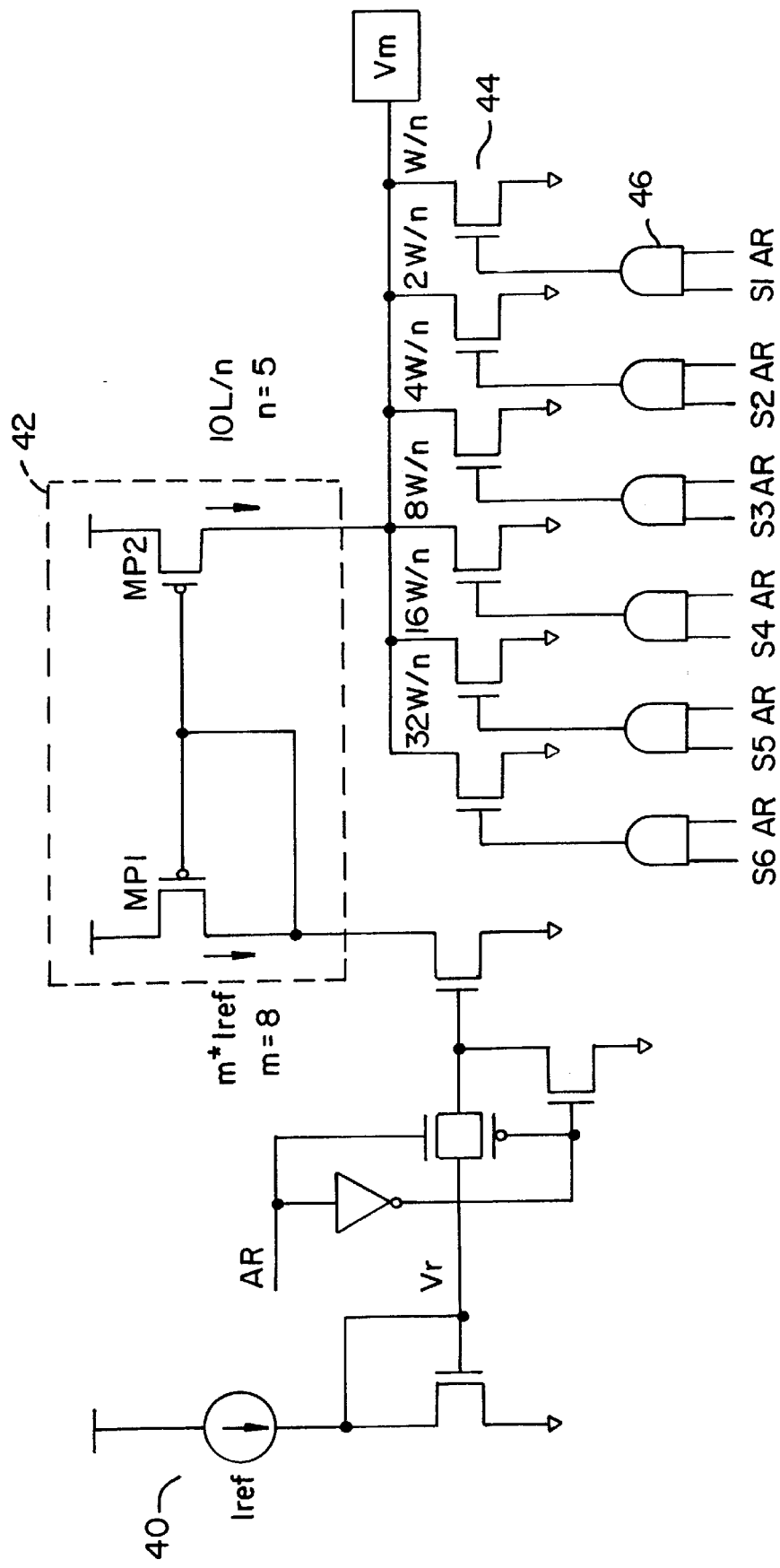
FIG. 4 is a simplified schematic diagram illustrating an embodiment of the pseudo-output driver in accordance with the present invention.

The current control circuit 22 as shown in FIG. 3 generally operates as follows. The comparator 32 compares the output of the pseudo-output driver 38, $V_m$, with a reference voltage $V_{ref}$ which is kept at, for example, 1.0V, and provides the result of the comparison in the form of the $\overline{U/D}$ signal to the D flip-flop 34 which is clocked by the $\overline{OSC}$ signal. Pseudo-output driver 38 replicates the output driver of FIG. 1 and is described in greater detail below in connection with FIG. 4. $V_m$ is the measured drain node voltage of the binary-weighted transistors of the pseudo-output driver 38. The D flip-flop 34 generates the UP and DN signals which can increment or decrement the 6-bit up/down counter 36. The up/down counter 36 then accordingly generates a 6-bit digital code that is outputted to the current control register 24 as well as the pseudo-output driver 38. The output of the pseudo-output driver 38 $V_m$ is adjusted and fed back to the comparator 32. The feedback loop operates to equalize $V_m$ with $V_{ref}$. FIG. 4 illustrates an exemplary embodiment of the pseudo-output driver 38 in accordance with the present invention. The pseudo-output driver 38 includes a reference current $I_{ref}$ 40, a current mirror 42, a number of binary-weighted transistors 44 that replicate those in the output driver 20 of FIG. 2, and a number of switching control devices 46. In a preferred embodiment, a bandgap reference current generator is used to supply $I_{ref}$ 40 (e.g., 100 $\mu$A). The use of a bandgap reference current generator provides a steady and relatively stable power supply and temperature-insensitive current level. In one implementation, it has been determined that the worst case variation of $I_{ref}$ is about 2.1% with the temperature ranging from about −10° C. to about 90° C. and the supply voltage ranging from about 2.25V to about 2.75V.

In this specific implementation, the current mirror 42 is formed by PMOS transistors MP1 and MP2. The function and implementation of a current mirror is commonly understood. As shown in FIG. 4, with $I_{ref}$ at about 100$\mu$A, the current mirror 42 feeds a current of about 4 mA (which is equal to $I_{OL}$/n, with n being a scalable factor of 5 in this example) into the binary-weighted NMOS transistors 44. Scaling is achieved by rationing of transistor sizes (MP1 to MP2). The binary-weighted transistors 44 used in the pseudo-output driver 38 replicate those of the output driver 20 in FIG. 2 but may be scaled down by a factor of n (in this example, n=5) to reduce power consumption.

The pseudo-output driver 38 as shown in FIG. 4 generally operates as follows. The pseudo-output driver 38 is turned on when the AR signal is activated during the auto refresh cycle. Each switching control device 46 implemented in the form of a logic AND function receives the AR signal as one of its inputs to ensure that the pseudo-output driver 38 is activated only when the auto refresh cycle is active. The 6-bit digital code received from the 6-bit up/down counter 36 is parsed and each bit of the digital code is coupled to each one of the binary-weighted transistors 44 via its gate terminal. As the value of the digital code (S1–S6) increases, the current through the binary-weighted NMOS transistors 44 increases as well thereby causing $V_m$ to decrease. Similarly, when the value of the digital code decreases, $V_m$ is caused to increase.

By the operation of the feedback loop formed by the comparator 32, the D flip-flop 34, the 6-bit up/down counter 36, and the pseudo-output driver 38, the value of the digital code is adjusted such that $V_m$ becomes about equal to $V_{ref}$ (at about 1.0V) and the current through the binary-weighted NMOS transistors 44 is about equal to $I_{OL}$/n. Preferably, the digital code is updated at the end of every auto refresh cycle to compensate for the drift of temperature and/or supply voltage.

Furthermore, the digital code generated by the 6-bit up/down counter 36 is also applied to the binary-weighted transistors 28 of all the output drivers. Thus, $I_{OL}$ of all the output drivers is maintained at a relatively stable level in spite of the variations of temperature and/or supply voltage. In one implementation, it has been determined that the worst case variation of $I_{OL}$ is at about 3.8% with the temperature ranging from about −10° C. to about 90° C. and the supply voltage ranging from about 2.25V to about 2.75V.

Figure 5:
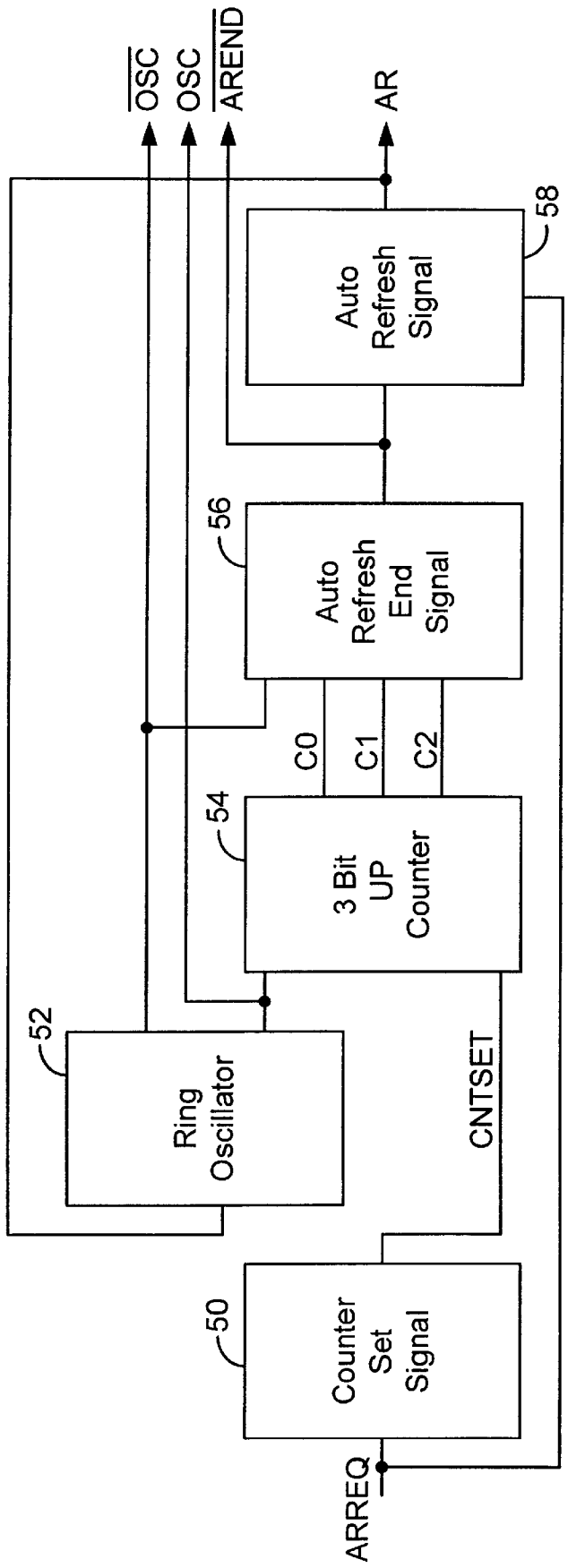
FIG. 5 is a simplified schematic diagram illustrating an embodiment of the auto refresh control circuit in accordance with the present invention.

FIG. 5 illustrates an exemplary embodiment of the auto refresh control circuit in accordance with the present invention. The auto refresh control circuit 30 includes a counter set signal circuit 50, a ring oscillator 52, a 3-bit up counter 54, an auto refresh end signal circuit 56, and an auto refresh signal circuit 58. The 3-bit up counter 54 receives two signals as its input, namely, an oscillation signal OSC from the ring oscillator 52 and a CNTSET (counter set) signal from the counter set signal circuit 50. The 3-bit output of the 3-bit up counter 54 and an oscillation signal $\overline{OSC}$ from the ring oscillator 52 are coupled as input to auto refresh end signal circuit 56. The output from the auto refresh end signal circuit 56, $\overline{AREND}$, is fed to the auto refresh signal circuit 58 which produces an auto refresh signal AR.

An AR_REQ (auto refresh request) signal is used to control the operation of the auto refresh control circuit 30. The AR_REQ signal is generated by decoding an auto refresh command which is asserted, for example, once every 15.6$\mu$s, by an external DRAM controller. More specifically, the AR_REQ signal is fed into the counter set signal circuit 50 and the auto refresh signal circuit 58 to enable their operation.

Figure 6:
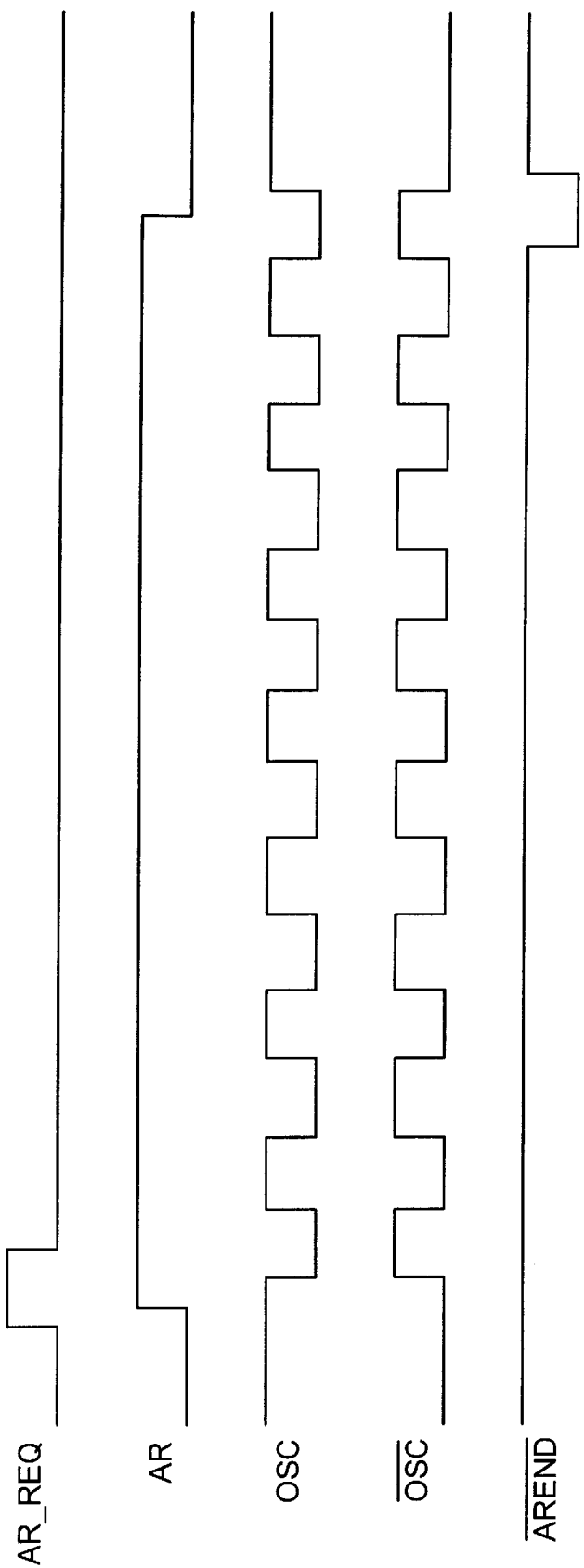
FIG. 6 is a simplified timing diagram of an embodiment of the auto refresh control circuit in accordance with the present invention.

As mentioned above, various signals from the auto refresh control circuit 30 including AR, OSC and $\overline{OSC}$ are used to control the digital code generated by the current control circuit 22 and the $\overline{AREND}$ is used to control the activation of the current control register 24. When the auto refresh operation is requested, the CNTSET signal sets the initial value of the 3-bit up counter 54 to "0" at the beginning of each auto refresh cycle, and the OSC and $\overline{OSC}$ signals then toggle until the AR signal is disabled by the $\overline{AREND}$ signal as shown in FIG. 6. The $\overline{AREND}$ signal is then activated when the outputs of the 3-bit up counter 54 are all about "1".

Table 1 below shows exemplary $V_{OL}$ variations due to changes in supply voltage and temperature. For example, in a specific embodiment, it can be seen that the worst case variation of VOL is about 3.8% with the temperature ranging from about −10° C. to about 90° C. and the supply voltage ranging from about 2.25V to about 2.75V. The operation of the output driver 20 implemented in accordance with the present invention has been experimentally verified at a data transfer rate of up to 0.8 Gb/s per pin. A 0.22$\mu$m triple-well CMOS process is used for this example.

TABLE 1

| $V_{DD}$[V] | Temp. [° C.] | $V_{OL}$[V] |
|---|---|---|
| 2.25 | −10 | 1.02 |
|  | 25 | 1.02 |
|  | 90 | 1.00 |
| 2.50 | −10 | 1.01 |
|  | 25 | 1.01 |

TABLE 1-continued

| $V_{DD}[V]$ | Temp. [° C.] | $V_{OL}[V]$ |
|---|---|---|
| | 90 | 1.03 |
| 2.75 | −10 | 0.99 |
| | 25 | 1.02 |
| | 90 | 0.99 | it is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An output driver for driving output data onto an output terminal, the output driver comprising:
    a first plurality of parallel-coupled driver transistors coupled to drive the output terminal
    a switching controller coupled to receive a multi-bit digital signal and the output data, and configured to respectively control the plurality of parallel-coupled driver transistors; and
    a current control circuit coupled to the switching controller and configured to generate the multi-bit digital signal to maintain a substantially stable output current over temperature and power supply variations.

2. The output driver according to claim 1, wherein the current control circuit is configured to generate the multi-bit digital signal based a feedback mechanism, the current control circuit further comprises:
    a second plurality of parallel-coupled driver transistors coupled to drive a feedback output of the current control circuit;
    a reference current source to provide current to the second plurality of parallel-coupled driver transistors;
    a comparator configured to generate a comparison result based on a comparison of the feedback output of the current control circuit and a reference voltage; and
    an up/down counter controlled by the comparison result and configured to generate the multi-bit digital signal to control the second plurality of parallel-coupled driver transistors.

3. The output driver according to claim 2, wherein said reference current source is a bandgap reference current generator.

4. A circuit for controlling an output driver driving an output terminal, comprising:
    a current control circuit having an output;
    a switching controller configured to receive said output from said current control circuit and output a switching signal; and
    a first plurality of switching devices coupled to said output terminal and configured to drive said output terminal in response to said switching signal and an output data signal;
    wherein said first plurality of switching devices are controlled by said switching signal; and
    wherein said current control circuit, said switching controller and said first plurality of switching devices are implemented on an integrated circuit chip.

5. The circuit according to claim 4, further comprising:
    a current control register configured to store said output of said current control circuit and relay said output to said switching controller;
    wherein said current control register is loaded on a periodic basis in response to a load signal.

6. The circuit according to claim 5, wherein said load signal is generated by an auto refresh signal in a dynamic random access memory.

7. The circuit according to claim 4, wherein said output of said current control circuit is a digital code; and
    wherein said switching controller is configured to couple each bit of said digital code to one of said first plurality of switching devices.

8. The circuit according to claim 4, wherein said switching controller is implemented using one or more logic AND functions.

9. The circuit according to claim 4, wherein said first plurality of switching devices is a plurality of binary-weighted transistors.

10. The circuit according to claim 4, wherein said current control circuit further comprises:
    a comparator capable of producing a comparison result;
    an up/down counter configured to receive said comparison result and generate an output which represents said output of said current control circuit; and
    a pseudo-output driver configured to generate a voltage output based on said output of said up/down counter;
    wherein said comparator compares a reference voltage with said voltage output to generate said comparison result; and
    wherein said up/down counter adjusts its output based on said comparison result.

11. The circuit according to claim 10, wherein activation of said current control circuit is controlled by an auto refresh control circuit.

12. The circuit according to claim 11, wherein said auto refresh control circuit is controlled by an auto refresh request signal.

13. The circuit according to claim 12, wherein said auto refresh request signal is generated by decoding an auto refresh command issued by an external memory device.

14. The circuit according to claim 10, wherein said pseudo-output driver further comprises:
    a bandgap reference current generator; and
    a second plurality of switching devices coupled in parallel to one another;
    wherein said bandgap reference current generator is configured to supply a relatively temperature-insensitive and supply-voltage-insensitive current source for said second plurality of switching devices; and
    wherein said second plurality of switching devices is controlled by said output of said up/down counter.

15. The circuit according to claim 14, wherein said plurality of switching devices is a plurality of binary-weighted transistors; and
    wherein the drain node voltage of said plurality of binary-weighted transistors represents said voltage output of said pseudo-output driver.

16. The circuit according to claim 15, wherein each one of said plurality of binary-weighted transistors is scalable.

17. A circuit for maintaining a steady output voltage for an open-drain output driver, comprising:
    a current control circuit configured to generate a digital control code, said current control circuit further comprising:
        a comparator configured to generate a comparison result;
        an up/down counter configured to generate an output based on said comparison result, wherein said output represents said digital control code;

a first plurality of binary-weighted switching devices coupled in a parallel configuration, wherein the drain node voltage of said first plurality of binary-weighted switching devices is compared to a voltage reference by said comparator to generate said comparison result; and a bandgap reference current generator for providing a current source for said first plurality of binary-weighted switching devices;

wherein said output of said up/down counter is coupled to said first plurality of binary-weighted switching devices;

a second plurality of binary-weighted switching devices; and a switching controller configured to receive said digital control code and couple each bit of said digital code to one of said second plurality of binary-weighted switching devices.

18. The circuit according to claim 17, wherein said current control circuit, said second plurality of binary-weighted switching devices and said switching controller are implemented on an integrated circuit chip.

19. The circuit according to claim 17, wherein said first and second plurality of binary-weighted switching devices are transistors.

20. The circuit according to claim 17, wherein said first plurality of binary-weighted switching devices are scalable.

21. The circuit according to claim 17, wherein said current control circuit is controlled by an auto refresh control circuit.

22. The circuit according to claim 21, wherein said auto refresh control circuit is controlled by an auto refresh request signal; and wherein said auto refresh request signal is generated based on an auto refresh command issued by an external memory device.

23. A method for maintaining a steady output voltage for an open-drain output driver, said output driver including a bandgap reference current generator for providing a current source to a plurality of binary-weighted switching devices coupled in a parallel configuration, comprising the steps of:

comparing the drain node voltage of said plurality of binary-weighted switching devices to a reference voltage to generate a comparison result;

generating a digital code using said comparison result; and switching said plurality of binary-weighted switching devices using said digital code;

wherein said steps are performed by components implemented on an integrated circuit chip.

24. The method according to claim 23, wherein said steps are controlled by an auto refresh request signal generated pursuant to an auto refresh command issued by an external memory device.

* * * * *